United States Patent [19]

Ohkubo

[11] Patent Number: 4,914,406
[45] Date of Patent: Apr. 3, 1990

[54] VOLTAGE CONTROLLED OSCILLATOR FREE FROM FREE-RUN OSCILLATING FREQUENCY ADJUSTMENT

[75] Inventor: Fumikazu Ohkubo, Tokyo, Japan
[73] Assignee: NEC Corporation, Japan
[21] Appl. No.: 340,427
[22] Filed: Apr. 19, 1989
[30] Foreign Application Priority Data
Apr. 25, 1988 [JP] Japan ................... 63-103287
[51] Int. Cl.⁴ .......................................... H03B 5/30
[52] U.S. Cl. ............................ 331/116 R; 331/177 R
[58] Field of Search ............ 331/116 R, 116 FE, 117 R, 331/117 FE, 158, 177 R

[56] References Cited
U.S. PATENT DOCUMENTS
3,986,145 10/1976 Hongu et al. ............... 331/116 R X 4,745,375 5/1988 Suzuki ...................... 331/116 R Primary Examiner—Eugene R. LaRoche
Assistant Examiner—Robert J. Pascal
Attorney, Agent, or Firm—Laff, Whitesel, Conte & Saret

[57] ABSTRACT

A voltage controlled oscillator free from free-run oscillating frequency adjustment is disclosed. This oscillator includes an amplifier having a positive feedback loop, a resonator connected to the output of the amplifier, and a variable reactance circuit connected to the output of the amplifier. The reactance circuit presents a reactance value variable by a control voltage to control an oscillation frequency of the oscillator. There is a further provided a low-pass filter which is connected in cascade to the variable reactance circuit. A high-pass filter is preferably inserted in the positive feedback loop.

6 Claims, 2 Drawing Sheets

VOLTAGE CONTROLLED OSCILLATOR FREE FROM FREE-RUN OSCILLATING FREQUENCY ADJUSTMENT

BACKGROUND OF THE INVENTION

1. Field of the Invention

The present invention relates to a voltage controlled oscillator (called hereinafter a "VCO") and, more particularly, to a VCO which is free from adjustment of a free-running oscillating frequency.

2. Description of the Prior Art

A VCO has been widely used for various systems. The VCO has a free-running oscillating frequency which should be adjusted to match the operation of the system in which the VCO is used, such as a PLL (Phase Locked Loop). For such usage, it is preferable for the free-running oscillating frequency to be automatically set to a center frequency of a capture range of the PLL circuit without any adjustment. In the prior art, the VCO used in a PLL circuit employs a resonance circuit consisting of a resistor and a capacitor, the value of the resistor and/or the value of the capacitor being adjusted to bring the free-running oscillating frequency into conformity with the center frequency. Such an adjustment requires considerable man-hours and time. Therefore, a VCO which does not require the free-running oscillating frequency adjustment has been widely demanded.

One such adjustment free VCO in the prior art is shown in FIG. 1 in a block diagram. This VCO includes an amplifier 8, a ceramic resonator 10 and a variable reactance circuit 11. The output of the amplifier 8 is positively fed back to the input thereof, and further connected to the ceramic resonator 10 and the variable reactance circuit 11. The output of the amplifier 8 is led out from an output terminal 9 of the VCO. The equivalent capacitance of the variable reactance circuit 11 is changed in accordance with a control voltage applied thereto via a control terminal 12. This equivalent capacitance will be referred to as "$C_v$". As shown in FIG. 1, the ceramic resonator 10 can be expressed by an equivalent circuit consisting of a parallel capacitance Ca, a series capacitance Cr, a series inductance L and a series resistance r. Therefore, the oscillation frequency $f_o$ obtained from the output terminal 9 can be expressed by the following formula (1):

$$f_o = \frac{1}{2\pi \sqrt{L \left( \frac{(Ca + Cv) \cdot Cr}{Ca + Cr + Cv} \right)}} \quad (1)$$

The oscillation frequency $f_o$ of the VCO is thus controlled by changing the equivalent capacitance Cv of the variable reactance circuit 11 (i.e., by the control voltage applied to the control terminal 12). Moreover, the variable reactance circuit 11 is designed in such a manner that is capcitance Cv becomes zero during the free-running oscillation of the VCO. In other words, at the time when no control voltage is applied to the control terminal 12, the free-running oscillating frequency of the VCO is automatically determined at the resonance frequency inherent to the ceramic resonator 10. Thus, the adjustment of the free-running oscillating frequency is unnecessary by employing the resonator 10 whose resonance frequency is the above-mentioned center frequency. Here, it is noted that the capacitance Cv of the variable reactance circuit 11 is designed at zero when no control voltage is applied but is designed so as to change from a negative value to a positive value by the control voltage.

Thus, the VCO shown in FIG. 1 does not require the adjustment of the free-running oscillating frequency. However, this VCO frequently oscillates at an abnormal oscillation frequency which is locked at a transient time such as at a power switching-on time.

More specifically, the ceramic resonator 10 has structurally two resonant frequencies, as seen from the impedance-to-frequency characteristic shown in FIG. 2. That is, the VCO oscillates stably at both of a first frequency $f_1$ of a lower resonant frequency and a second frequency $f_2$ in an upper resonant frequency. The second frequency $f_2$ is as large as about 10 times the first frequency $f_1$. As is understood from the formula (1), when the equivalent capacitance component Cv of the variable reactance circuit 11 approaches the parallel capacitance Ca, the oscillation frequency $f_o$ becomes higher to approach the second frequency $f_2$. In normal operation, the variable range of the equivalent capacitance Cv of the variable reactance circuit 11 is controlled so that it does not approach the parallel capcitance Ca. However, at the transient response time such as switching-on the power, this control does not operate sufficiently, so that the VCO is locked to oscillate at the oscillation of the second frequency $f_2$.

Moreover, the oscillation loop including the ceramic resonator 10 does not often operate, so that the oscillation inherent to the circuit structure of the amplifier 8 and the variable reactance circuit 11 occurs. This oscillation frequency is lower than the frequency $f_1$.

In any of these cases, the VCO does not oscillate at the desired free-running oscillation frequency, so that the PLL circuit does not operate.

SUMMARY OF THE INVENTION

Therefore, an object of the present invention is to provided an improved VCO which does not require a free-running oscillating frequency adjustment.

Another object of the present invention is to provide a VCO which does not require an adjustment of a free-run oscillating frequency, while preventing an abnormal free-running oscillation.

A VCO, according to the present invention, comprises an amplifier having a positive feedback loop, a resonator connected to an output of the amplifier, and a variable reactance circuit connected to the output of the amplifier and including a low-pass filter therein. The variable reactance circuit presents a controllable capacitance value to control the oscillation frequency of the VCO the amplifier is supplied with an oscillation control voltage to control the controllable capacitance value.

That is, the inventive VCO has a low-pass filter in the variable reactance circuit. The low-pass filter prevents abnormal oscillation at the second resonant frequency of the resonator.

According to another aspect of the invention, a high-pass filter is further provided in the positive feedback loop of the amplifier to prevent the VCO from oscillating at a frequency which is determined by only the amplifier and the reactance circuit.

BRIEF DESCRIPTION OF THE DRAWING

The above and other objects, advantages and features of the present invention will be more apparent from the following description taken in conjunction with the accompanying drawings, in which.

DETAILED DESCRIPTION OF THE PREFERRED EMBODIMENTS

Figure 1:
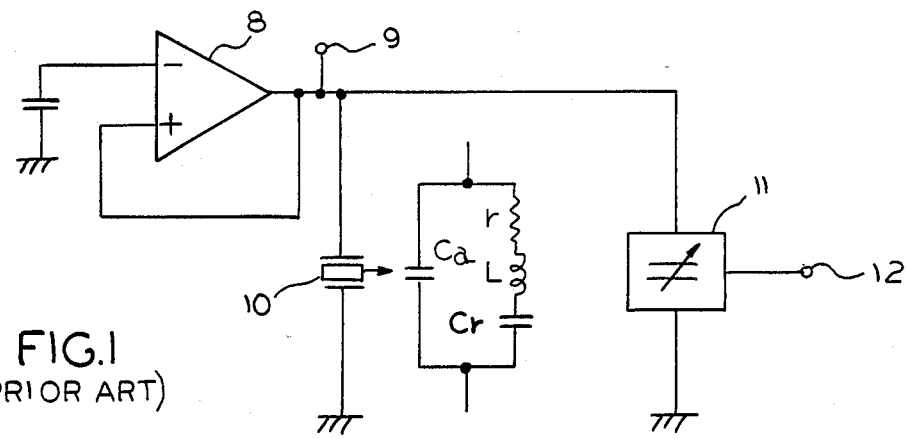
FIG. 1 is a block diagram representative of a prior art VCO.
Figure 2:
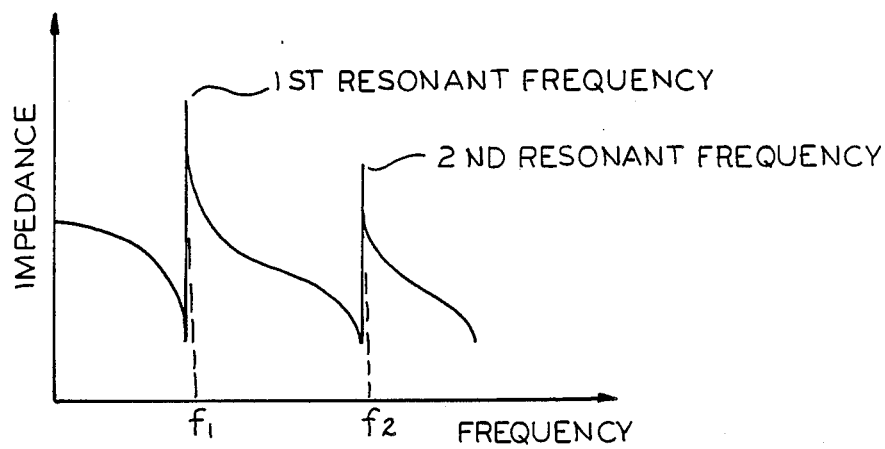
FIG. 2 is a graph representative of an impedance-to-frequency characteristic of a ceramic resonator.
Figure 3:
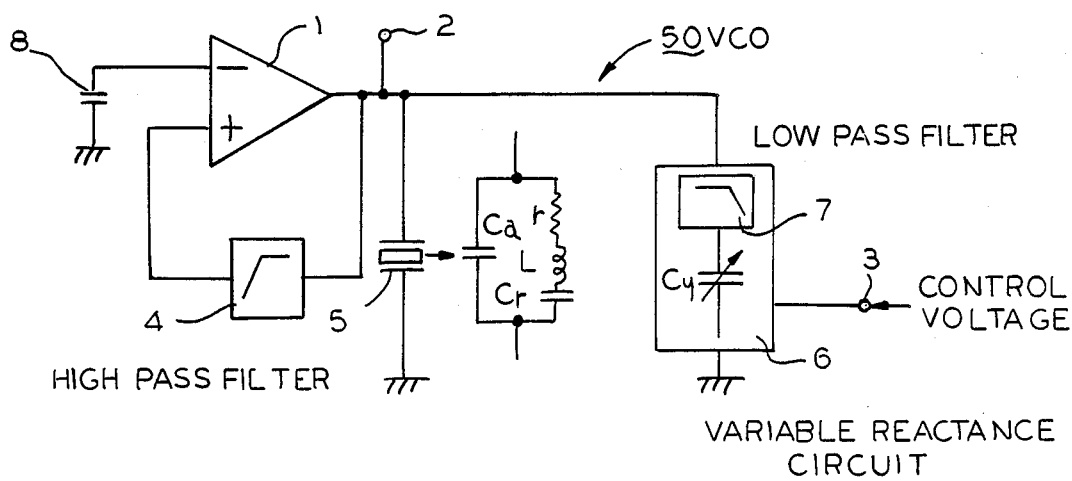
FIG. 3 is a block diagram representative of a VCO according to an embodiment of the present invention.

Referring to FIG. 3, a VCO 50 according to an embodiment of the present invention includes a differential amplifier 1, a high-pass filter 4, a ceramic resonator 5, a variable reactance circuit 6 having a los-pass filter 7 therein, and a bias voltage source 8. The output node of the amplifier 1 is led out as an oscillation output terminal 2 and is fed back to a non-inverting input node (+) thereof through the high-pass filter 4. That is, the amplifier 2 has a positive feedback loop provided with the high-pass filter 4. The inverting input node (−) of the amplifier 1 is biased by the bias voltage source 8. The ceramic resonator 5 and the variable reactance circuit 6 including the low-pass filter 7 are connected to the output terminal 2. In other words, the circuit 6 and the low-pass filter 7 are connected in cascade to the amplifier 1. An oscillation control voltage is supplied to the circuit 6 via a control terminal 3. As shown in the equivalent circuit diagram of FIG. 3, the ceramic resonator 5 has a equivalent of a parallel capacitance Ca, a series capacitance Cr, a series inductance L and a series resistance r connected as shown.

The cut-off frequency of the low-pass filter 7 is designed to be between the first and second resonant frequencies $f_1$ and $f_2$ of the ceramic resonator 5 shown in FIG. 3. The cut-off frequency of the high-pass filter 4 is designed to be lower than the first resonant frequency $f_1$. Accordingly, the oscillation frequency $f_o$ of the VCO 50 of this embodiment is also expressed by the formula (1).

Upon the free-running oscillation, i.e. upon non-controlling, the variable reactance circuit 6 is constructed such that the equivalent capacitance Cv thereof is zero. Therefore, the free-running oscillating frequency of the VCO 50 is equal to the resonance frequency inherent to the ceramic resonator 5, so that an adjustment of the free-running frequency is not required. The control voltage applied to the terminal 3 changes the capacitance Cv of the variable reactance circuit 6 from a negative capacitance value to a positive capacitance value. The oscillation frequency $f_o$ of the VCO 50 is controlled thereby.

Since the cut-off frequency of the low-pass filter 7 is designed to be between the first and second resonant frequencies $f_1$ and $f_2$ of the resonator 5 to cut off the frequencies which are higher than the frequency variable range required to the VCO 50. Namely, the low-pass filter 7 restricts the equivalent capacitance Cv of the variable reactance circuit 6 to change it in a negative direction. As a result, the oscillation at the second resonant frequency $f_2$ of the ceramic resonator 5 is prevented. The high-pass filter 4 disposed in the positive feedback loop of the amplifier 1 cuts off the frequencies which are lower than the frequency variable range required to the VCO 50. Therefore, it is possible to prevent oscillation at the inherent frequency which is determined solely by a capacitance component in the amplifier 1 and the variable reactance circuit 6.

Thus, the VCO 50 is controlled to make the most stable oscillation at a frequency near the first resonant frequency $f_1$ of the ceramic resonator 5 by the low-pass filter 7 and the high-pass filter 7, and can be free from the abnormal oscillation locked at a transient time such as occur at the switching-on of power.

Figure 4:
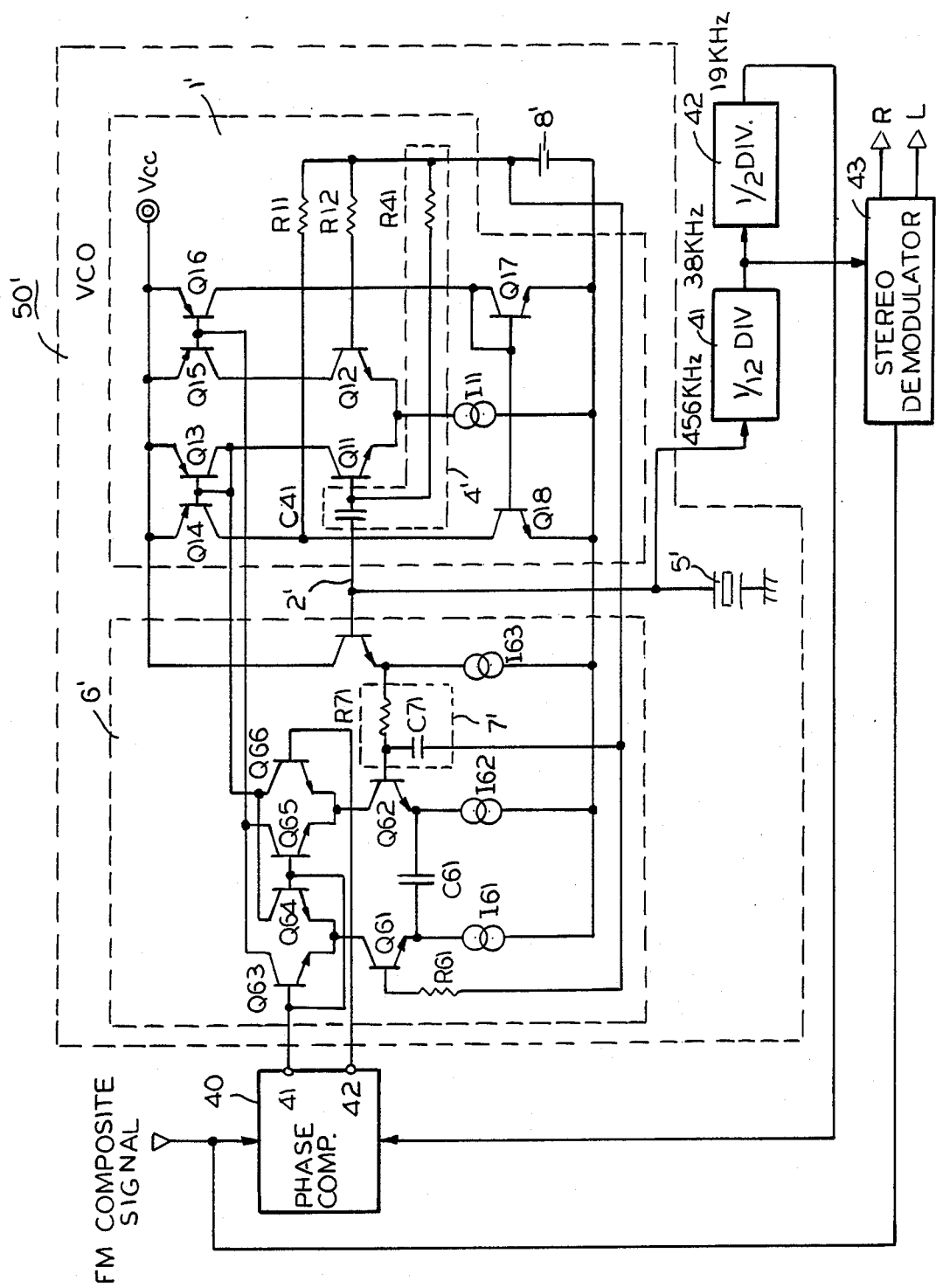
FIG. 4 is a circuit diagram of a PLL stereo demodulator employing a VCO according to another embodiment of the present invention.

Turning to FIG. 4, there is shown a PLL stereo demodulator circuit employing a VCO 50' according to another embodiment of the present invention. An FM composite signal containing a sum signal (R+L) of right (R) and left (L) channels, a difference signal (R−L) modulated by a 38 KHz subcarrier signal and a 19 KHz pilot signal is supplied to one of two input terminals of a phase comparator 40, the other input terminal which is supplied with a 19 KHz signal from a second frequency divider 42 described later.

The phase comparator 40 compares the phase of the signal from the frequency divider 42 with the phase of the pilot signal in the FM composite signal. Comparator 40 generates the D.C. voltage signals representative of the phase difference therebetween at the output terminals 41 and 42, in a true and complementary manner. That is, when no FM composite signal is supplied to the phase comparator 40, i.e. when the VCO 50' is free-running each of, the terminals 41 and 42 have the same voltage level.

When the FM composite signal is supplied, the terminal 41 changes from the no signal voltage level in a positive or negative direction in accordance with the phase difference, whereas the terminal 42 changes in an opposite direction by the same amount. The output voltage signal from the phase comparator 40 controls the oscillation frequency of the VCO 50'. The oscillation signal of VCO 50' is frequency-divided by a first frequency divider 41 to produce a 38 KHz signal. This 38 KHz signal is divided by the second frequency divider 42 to obtain the 19 KHz signal. The 38 KHz signal from the frequency divider 41 is supplied to a stereo demodulator 43 which is also supplied with the FM composite signal.

VCO 50' includes an amplifier 1', a bias voltage source 8', a high-pass filter 4', a ceramic resonator 5', and a variable reactance circuit 6' having a low-pass filter 7', similar to the VCO 50 shown in FIG. 3. The amplifier 1' includes transistors $Q_{11}$ and $Q_{12}$ connected in a differential circuit form, a current source $I_{11}$, and three pairs of transistors $Q_{13}$ and $Q_{14}$; $Q_{15}$ and $Q_{16}$; and $Q_{17}$-$Q_{18}$, each pair forming a current mirror. The base of the transistor $Q_{12}$ operates as an inverting input terminal (−) of the amplifier 1' and is thus supplied with a bias voltage from the bias source 8' through a resistor $R_{12}$. The connection point of the transistors $Q_{14}$ and $Q_{18}$ is an output terminal 2' of the amplifier 1' and is thus fed back to the base of the transistor $Q_{11}$ (the non-inverting input terminal (+) of the amplifier 1') through the high-pass filter 4'. The bias source 8' is also connected to the non-inversion input terminal (+) through a resistor $R_{11}$.

The high-pass filter 4' consists of a capacitor $C_{41}$ and a resistor $R_{41}$. The ceramic resonator 5' and the variable reactance circuit 6' are connected to the output terminal 2'. The variable reactance circuit 6 includes transistors $Q_{61}$ through $Q_{67}$, current sources $I_{61}$ through $I_{65}$, a capacitor $C_{61}$ and a resistor $R_{61}$ which are connected as shown. Particularly, the output 2' of the amplifier 1' is supplied to the base of the transistor $Q_{62}$ through the emitter-follower transistors $Q_{67}$ and the low-pass filter 7' consisting of a resistor $R_{71}$ and a capacitor $C_{71}$. The transistor $Q_{61}$ is connected to the transistor $Q_{62}$ through the capacitor $C_{61}$ in a differential form. The base of the transistor $Q_{61}$ is connected to the bias source 8' through the resistor $R_{61}$.

The first output terminal 41 of the phase comparator 40 is connected in common to the bases of the transistors $Q_{63}$ and $Q_{66}$, and the second output terminal 42 is connected in common to the bases of the transistors $Q_{64}$ and $Q_{65}$. The collectors of the transistors $Q_{63}$ and $Q_{65}$ are connected in common to the collector of the transistor $Q_{15}$ and the collectors of the transistors $Q_{64}$ and $Q_{66}$ are connected in common to the collector of the transistor $Q_{13}$. The transistors $Q_{63}$ and $Q_{65}$ constitutes a double balance differential circuit.

In the construction described above, the phase comparator 40 generates the same voltage at the output terminals 41 and 42 upon the free-running. Hence, the currents flowing through the transistors $Q_{63}$ to $Q_{66}$ are all equal to one another. Accordingly, the equivalent capacitance of the variable reactance circuit 6' is zero, so that the VCO 50' oscillates in a free-running mode at the first resonant frequency $f_1$ of the ceramic resonator 5'. In this embodiment, the free-running oscillating frequency is designed to be 456 KHz. The second resonant frequency $f_2$ of the ceramic resonator 5' is about 4 to 6 MHz. The resonator 5' has the capacitance Ca of about 300 pF. The capacitance value of the capacitor $C_{71}$ and the resistance value of the resistor $R_{71}$ in the low-pass filter 7' are 16 pF and 10 K$\Omega$, respectively. The cut-off frequency of the low-pass filter 7' is thus about 1 MHz. Therefore, it is possible to prevent the oscillation of the VCO 50' at the second resonant frequency $f_2$ (4 to 6 MHz).

Since the free-running oscillating frequency of VCO 50' is 456 KHz, the frequency division ratio of the frequency divider 41 is set to 1/12. The 38 KHz signal is derived therefrom. The phase comparator 40 compares the phases of the input pilot signal and the signal from the frequency divider 42 and controls the base voltage difference between the transistors $Q_{62}$ ($Q_{66}$) and $Q_{64}$ ($Q_{65}$) in accordance with that phase difference. Since the output is taken out of the variable reactance circuit 6' in the double-end fashion, the equivalent capacitance Cv can be made variable from $-2C_{611}$ to $+2C_{611}$, where $C_{611}$ represents the capacitance value of the capacitor $C_{61}$. In this embodiment, the capacitance value $C_{611}$ is 100 pF. As a result, the oscillation frequency of VCO 50' is controlled so that there is a predetermined phase difference between the pilot signal and the signal from the frequency divider 42.

The stereo demodulator 43 subjects the FM composite signal to the stereo demodulation by use of the 38 KHz signal from the frequency divider 41 and thus generates the right channel signal R and the left channel Signal L, as is well-known in the art. The values of the capcitor $C_{41}$ and resistor $R_{41}$ in the high-pass filter 4' are set to 33 pF and 15 K$\Omega$, respectively. Therefore, the high-pass filter 4' has a cut-off frequency of about 100 Hz, and thus prevents the VCO 50' from oscillating at the inherent frequency which is determined by only the amplifier 1' and the variable reactance circuit 6' (about 50 Hz).

The present invention is not limited to the above embodiment, but may be modified and changed without departing from the scope and spirit of the invention. For example, the ceramic resonator 5 (5') may be replaced by a crystal resonator.

What is claimed is:

1. A voltage controlled oscillator oscillating at a frequency which is variable by a control voltage, said oscillator comprising an amplifier having input and output terminals and a positive feedback circuit provided between the input and output terminals, a resonator coupled to the output terminal of said amplifier, circuit means supplied with said control voltage and having a controllable capacitance component which is controlled by said control voltage, a low-pass filter coupled to said circuit means in cascade to the output terminal of said amplifier.

2. The oscillator as claimed in claim 1, wherein said resonator has a first resonant frequency and a second resonant frequency different from said first resonant frequency and said low-pass filter has a cut-off frequency between said first and second resonant frequencies.

3. The oscillator as claimed in claim 1, wherein said circuit means includes first and second transistors connected in a differential form through a capacitor and said low-pass filter is connected between the output terminal of said amplifier and a control electrode of said first transistor.

4. A voltage controlled oscillator oscillating at a frequency which is varied by a control voltage, comprising an amplifier having input and output terminals and being formed with circuits elements including a capacitive element, a high-pass filter, means for coupling said high-pass filter to said amplifier to form a positive feedback circuit from the output terminal to an input terminal of said amplifier, a resonator, means for coupling said resonator to the output terminal of said amplifier, a variable reactance circuit supplied with said control voltage and presenting reactance controllable with a value of said control voltage, and a low-pass filter coupled between said amplifier and said variable reactance circuit.

5. The oscillator as claimed in claim 4, wherein said resonator has a first resonant frequency and a second resonant frequency higher than said first resonant frequency, said high-pass filter having a cut-off frequency lower than said first resonant frequency, and said low-pass filter having a cut-off frequency between said first and second resonant frequencies.

6. The oscillator as claimed in claim 4, wherein said amplifier has an inverting input terminal and a non-inverting input terminal and said high-pass filter is coupled between said output terminal and said non-inverting input terminal, said inverting input terminal being supplied with a bias voltage.

* * * * *